United States Patent
Schoellkopf

(10) Patent No.: US 6,525,582 B2
(45) Date of Patent: Feb. 25, 2003

(54) LATCH OPERATING WITH A LOW SWING CLOCK SIGNAL

(75) Inventor: Jean-Pierre Schoellkopf, Grenoble (FR)

(73) Assignee: SGS-Thomson Microelectronics S.A., Gentilly (FR)

( * ) Notice: Subject to any disclaimer, the term of this patent is extended or adjusted under 35 U.S.C. 154(b) by 0 days.

(21) Appl. No.: 09/843,253

(22) Filed: Apr. 26, 2001

(65) Prior Publication Data

US 2002/0017937 A1 Feb. 14, 2002

Related U.S. Application Data

(63) Continuation of application No. 09/161,153, filed on Sep. 25, 1998, now abandoned.

(30) Foreign Application Priority Data

Sep. 30, 1997 (FR) .............................. 97/12390

(51) Int. Cl.[7] .......................... H03K 3/037; H03K 3/12
(52) U.S. Cl. ..................... 327/218; 327/208; 327/210; 327/211
(58) Field of Search ................. 327/199, 200, 327/201, 208, 209, 210, 211, 212, 218, 219

(56) References Cited

U.S. PATENT DOCUMENTS

| | | | | |
|---|---|---|---|---|
| 4,333,020 A | | 6/1982 | Maeder | 327/212 |
| 4,356,411 A | | 10/1982 | Suzuki et al. | 327/203 |
| 4,644,185 A | | 2/1987 | Todd | 327/208 |
| 5,049,760 A | | 9/1991 | Ooms | 327/212 |
| 5,748,020 A | * | 5/1998 | Mactaggart et al. | 327/218 |
| 5,821,791 A | | 10/1998 | Gaibotti et al. | 327/202 |
| 6,278,308 B1 | * | 8/2001 | Partovi et al. | 327/218 |

OTHER PUBLICATIONS

French Search Report from French Patent Application 97 12390, filed Sep. 30, 1997.

* cited by examiner

*Primary Examiner*—Tuan T. Lam
(74) *Attorney, Agent, or Firm*—Wolf, Greenfield & Sacks, P.C.; James H. Morris

(57) ABSTRACT

The present invention relates to a latch including two first N-channel transistors connected to a low supply potential and controlled by a clock signal; two second transistors respectively connecting the two first transistors to an inverted output terminal and to a non-inverted output terminal and respectively controlled by a data line and a complementary data line; two third P-channel transistors respectively coupling the two second transistors to a high supply potential and cross-controlled by the output terminals; and circuitry for maintaining the states of the output terminals when the first transistors are non-conductive.

6 Claims, 1 Drawing Sheet

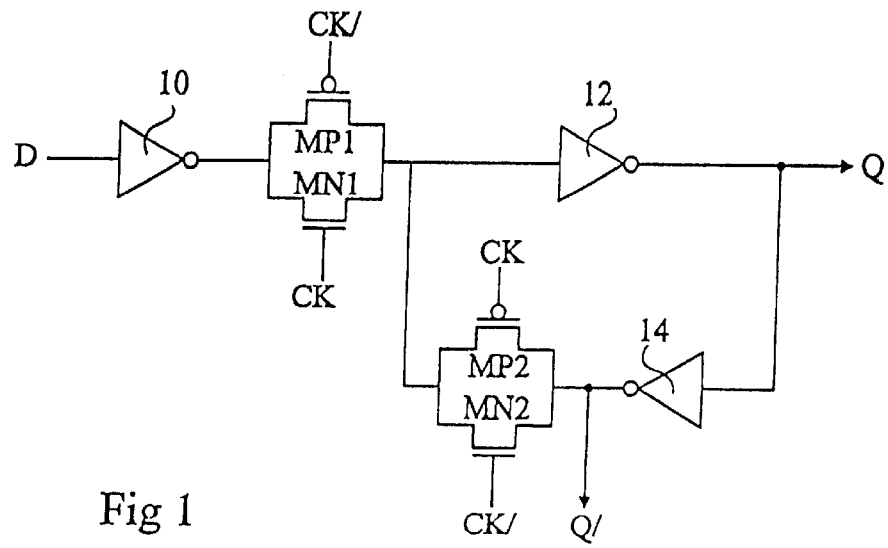
Fig 1
PRIOR ART
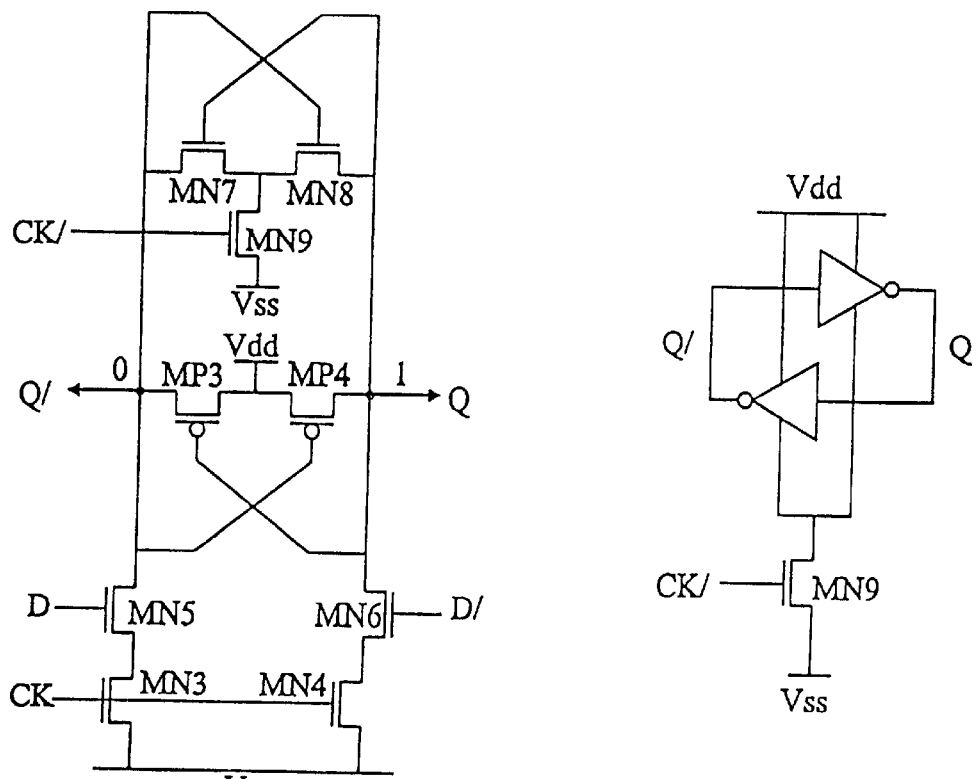
Fig 2
Fig 3

LATCH OPERATING WITH A LOW SWING CLOCK SIGNAL

This application is a continuation of U.S. Ser. No. 09/161,153 filed Sep. 25, 1998 now abandoned.

BACKGROUND OF THE INVENTION

1. Field of the Invention

The present invention relates to a latch, i.e., a circuit which, for a first state of a clock signal, transmits without modification a datum present at its input and, for a second state of the clock signal, stores or locks the last state of the datum. The present invention more specifically relates to such a latch which operates with a low swing clock signal for the purpose of reducing the power consumed by the distribution of the clock signal.

2. Discussion of the Related Art

FIG. 1 show s a convention al latch. Datum D is applied on the input of an inverter 10, the output of which is coupled to the input of an inverter 12 via a switch formed of the parallel association of an N-channel MOS transistor MN1 with a P-channel MOS transistor MP1. Transistor MN1 is controlled by a clock signal CK, while transistor MP1 is controlled by the complement CK/ of this clock signal. The output of inverter 12 forms the output Q of the latch. This output Q is further connected to the input of an inverter 14, the output of which forms a complementary output Q/ of the latch. This output Q/ is connected to the input of inverter 12 via a switch formed of the parallel association of an N-channel MOS transistor MN2 with a P-channel MOS transistor MP2. Transistor MN2 is controlled by complementary clock signal CK/ while transistor MN2 is controlled by clock signal CK.

Two types of transistors are provided in each switch, since only one will be properly conductive according to the level of the signal to be transmitted. More specifically, the P-channel transistor will transmit the high levels of the signal, and the N-channel will transmit the low levels.

When clock signal CK is high, switch MN1-MP1 is on whereas switch MN2-MP2 is off. The state of datum D is then transmitted as is to output Q via inverters 10 and 12.

When clock signal CK is low, switch MN1-MP1 is off whereas switch MN2-MP2 is on. Inverter 10 is disconnected from the input of inverter 12 whereas inverters 12 and 14 are connected head-to-tail to form a memory node which stores the state of signal D at the time when clock CK switched to the low state.

The power consumed to distribute the clock signal is proportional to $CFV^2$, where C is the capacitance of the clock line, F is the frequency of the clock signal, and V is the peak-to-peak voltage, or swing, of the clock signal. Since integrated circuits become larger and larger and operate at higher and higher frequencies, the power consumed for the clock signal distribution becomes significant.

In recent circuits, it has been attempted to use a clock signal having a much lower swing than the nominal supply voltage of the circuit, which reduces considerably the consumed power, since the power increases with the square of the clock signal swing. For example, for circuits operating at a nominal voltage of 3.3 or 2.5 volts, one uses a clock signal varying between 0 and 1 volt, which reduces the consumed power by a factor 10 or 6, respectively.

However, some circuits, especially latches of the type of FIG. 1, cannot operate with a clock signal varying between 0 and 1 volt. Indeed, the 1-volt maximum value of clock signal CK or CK/ is too far from the nominal supply voltage to turn off P-channel MOS transistors MP1 and MP2. Accordingly, when clock signal CK is low, and switch MN1-MP1 is supposed to be off, transistor MP1 is however capable of passing a high level which may cause a switching of the memory node formed by inverters 12 and 14. Further, N-channel transistors MN1 and MN2, controlled by a voltage close to their threshold voltage, are only slightly conductive and may even not be conductive at all if their sources are at a residual potential above the low supply potential. This may especially happen in the case of FIG. 1, where the sources of transistors MN1 and MN2 are connected to the low potential via transistors forming inverters 10 and 14.

SUMMARY OF THE INVENTION

An object of the present invention is to provide a latch which can operate with a low swing clock.

This and other objects are achieved by means of a latch including two first transistors of a first conductivity type connected to a first supply potential and controlled by a clock signal; two second transistors respectively connecting the two first transistors to an inverted output terminal and to a non-inverted output terminal and respectively controlled by a data line and a complementary data line; two third transistors of a second conductivity type respectively coupling the two second transistors to a second supply potential and cross-controlled by the output terminals; and means for maintaining the states of the output terminals when the first transistors are off.

According to an embodiment of the present invention, said means include two fourth transistors of the first conductivity type respectively connecting the output terminals to the first supply potential via a fifth transistor of the first conductivity type, and cross-controlled by the output terminals, the fifth transistor being controlled by an inverted clock signal.

According to an embodiment of the present invention, the on-state conductivity of the third transistors is lower than that of the series connection of one of the first transistors with one of the second transistors.

According to an embodiment of the present invention, the first conductivity type is type N, the first supply potential is a low potential, the second supply potential is a high potential, and the level of the clock signal varies between the low supply potential and a level lower than the high supply potential.

The foregoing objects, features and advantages of the present invention will be discussed in detail in the following non-limiting description of specific embodiments made in connection with the accompanying drawings.

BRIEF DESCRIPTION OF THE DRAWINGS

FIG. 1, previously described, shows a conventional latch;

FIG. 2 shows an embodiment of a latch according to the present invention; and

FIG. 3 shows an equivalent diagram of a portion of the latch of FIG. 2.

DETAILED DESCRIPTION

In FIG. 2, a latch according to the present invention includes two N-channel MOS transistors MN3 and MN4, the sources of which are directly connected to low supply potential Vss. Both transistors are controlled by a clock signal CK. Two N-channel MOS transistors MN5 and MN6 connect transistors MN3 and MN4 respectively to an inverted output terminal Q/ and to a non-inverted output terminal Q of the latch. Transistors MN5 and MN6 are respectively controlled by a datum D and its complement D/. Output terminals Q/ and Q are connected to high supply potential Vdd via two respective P-channel MOS transistors MP3 and MP4. Transistors MP3 and MP4 are cross-controlled by outputs Q/ and Q, that is, the gate of transistor MP4 is connected to output Q/ while the gate of transistor MP3 is connected to output Q.

The operation of the latch can already be understood without considering the elements of the upper portion of FIG. 2 which will be described hereafter.

When clock signal CK is low, transistors MN3 and MN4 are off. Then, that of outputs Q and Q/ which is at 0 floats and maintains its state by capacitive effect. For example, output Q/ floats and its 0 state is maintained by the gate capacitance of transistor MP4. The gate of transistor MP4, thus being at 0, transistor MP4 is on and transmits high supply potential Vdd, i.e., state 1, to output Q. As long as transistors MN3 and MN4 are off, the state of the latch cannot be altered neither by datum D, nor by its complement D/, that is, the latch is in the locked state.

When signal CK is at a value slightly above the threshold voltage of transistors MN3 and MN4, these transistors turn on.

In this case, if datum D is at state 1, transistor MN5 is on and draws output Q/ towards potential Vss, that is, towards state 0. In the example, this has no effect upon the state of the latch. Transistor MN6, receiving state 0 on its gate, is off and cannot alter the state of output Q.

If datum D is at state 0, transistor MN5 is off and transistor MN6 turns on and draws output Q towards potential Vss, which alters state 1 of output Q in the example. For the state of output Q to be drawn to 0, transistor MP4 is sized to have a lower conductivity than that of the series connection of transistors MN6 and MN4. In this case, the potential of output Q ends up decreasing to the threshold voltage of transistor MP3 which then turns on. Transistor MP3 rapidly increases the potential of output Q/ towards potential Vdd, since output Q/ is floating. The level of output Q/ rapidly exceeds the threshold of transistor MP4 which turns off and enables output Q to be drawn to potential Vss unimpeded.

If the state of datum D changes again while signal CK still is high, the state of the latch also changes, and this, symmetrically to what has just been described. In other words, as long as signal CK is high, the latch is transparent.

The latch can properly operate with a clock signal of reduced swing, varying, for example, between 0 and 1 volt, since it uses circuitry that enables this such as N-channel transistors, the sources of which are directly connected to low supply potential Vss.

With the elements just described, when the latch is locked on a state, this state is only maintained by capacitive effect. Leakage currents could thus cause a modification of the state of the latch when it remains locked for too long.

The circuit of the upper portion of FIG. 2 is provided to avoid this. This circuit includes two N-channel MOS transistors MN7 and MN8 connected in series between outputs Q/ and Q. Transistors MN7 and MN8 are cross-controlled, that is, the gate of transistor MN8 is connected to output Q/ and the gate of transistor MN7 is connected to output Q. The connection node between transistors MN7 and MN8 is connected to low potential Vss by an N-channel MOS transistor MN9 which is controlled by the complement CK/ of clock signal CK.

When the latch is in the transparent state, that is, when clock signal CK is high, transistor MN9 is off. As a result, transistors MN7 and MN8 do not interfere in the operation just described.

When the latch is in the locked state, that is, when signal CK is low, transistor MN9 turns on. Considering again the example where output Q is at 1 and output Q/ is at 0, transistor MN7 is on while transistor MN8 is off. Thus, output Q/ is connected to potential Vss via transistors MN7 and MN9, which confirms the 0 state of this output Q/. State 1 of output Q is still confirmed by transistor MP4. The two latch outputs are thus confirmed and no drift due to a leakage current is possible.

Signal CK/ may be of low swing, like signal CK, since the type and the connection mode of MOS transistor MN9 are the most appropriate for this purpose.

FIG. 3 shows an equivalent diagram of the upper portion of the latch of FIG. 2. Transistors MP3, MP4, MN7, and MN8 form two inverters connected head-to-tail. These inverters are directly supplied by high potential Vdd and supplied from low potential Vss via transistor MN9.

Of course, the present invention is likely to have various alterations, modifications, and improvements which will readily occur to those skilled in the art. Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalent thereto.

What is claimed is:

1. A latch including:
   two first transistors of a first conductivity type connected to a first supply potential and controlled by a clock signal;
   two second transistors respectively connecting the two first transistors to an inverted output terminal and to a non-inverted output terminal and respectively controlled by a data line and a complementary data line;
   two third transistors of a second conductivity type respectively coupling the two second transistors to a second supply potential and cross-controlled by the output terminals; and
   two fourth transistors of the first conductivity type respectively connecting the output terminals to the first supply potential via a fifth transistor of the first conductivity type, and cross-controlled by the output terminals, the fifth transistor being controlled by an inverted clock signal.

2. The latch of claim 1, wherein the on-state conductivity of the third transistors is lower than that of the series connection of one of the first transistors with one of the second transistors.

3. The latch of claim 1, wherein the first conductivity type is type N, the first supply potential is a low potential, the second supply potential is a high potential, and the level of the clock signal varies between the low supply potential and a level lower than the high supply potential.

4. A latch including:
   two first transistors of a first conductivity type connected to a first supply potential and controlled by a clock signal;
   two second transistors respectively connecting the two first transistors to an inverted output terminal and to a non-inverted output terminal and respectively controlled by a data line and a complementary data line;
   a third transistor of the first conductivity type connected to the first supply potential and controlled by an inverted clock signal; and a pair of inverters connected head-to-tail, each inverter of said pair of inverters having a supply line connected to a second supply potential and a supply line connected to said third transistor.

5. The latch of claim 4, wherein the on-state conductivity of the third transistor is lower than that of the series connection of one of the first transistors with one of the second transistors.

6. The latch of claim 4, wherein the first conductivity type is type N, the first supply potential is a low potential, the second supply potential is a high potential, and the level of the clock signal varies between the low supply potential and a level lower than the high supply potential.

* * * * *